US006956684B2

(12) United States Patent
Orcutt

(10) Patent No.: US 6,956,684 B2
(45) Date of Patent: Oct. 18, 2005

(54) MULTILAYERED OSCILLATING DEVICE WITH SPINE SUPPORT

(75) Inventor: John W. Orcutt, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 177 days.

(21) Appl. No.: 10/681,934

(22) Filed: Oct. 9, 2003

(65) Prior Publication Data

US 2005/0185239 A1    Aug. 25, 2005

Related U.S. Application Data

(60) Provisional application No. 60/424,915, filed on Nov. 8, 2002.

(51) Int. Cl.$^7$ .......................... G02B 26/08; H02K 33/00
(52) U.S. Cl. ...................... 359/198; 359/199; 359/224; 310/36
(58) Field of Search ............................... 359/198, 199, 359/221–226, 212–214; 310/36, 40 R, 46, 310/40 MM, 152; 335/229, 302

(56) References Cited

U.S. PATENT DOCUMENTS

| 5,629,790 | A | * | 5/1997 | Neukermans et al. ........ 359/198 |
| 5,999,303 | A | * | 12/1999 | Drake ......................... 359/224 |
| 6,201,629 | B1 | * | 3/2001 | McClelland et al. ......... 359/223 |
| 6,295,154 | B1 | | 9/2001 | Laor et al. |

* cited by examiner

Primary Examiner—James Phan
(74) Attorney, Agent, or Firm—William B. Kempler; W. James Brady, III; Frederick J. Telecky, Jr.

(57) ABSTRACT

A multilayered torsional hinged device such as a scanning mirror including a hinge layer with an attaching member pivotally supported by torsional hinges. A front layer is bonded to the front side of the attaching member and a back layer is bonded to the back side of the attaching member. The front layer and the back layer have equal mass moments to balance the moment of inertia and stresses on the torsional hinges. Further, the attaching member and a back portion of the front layer define a spine structure that extends to the tips of the mirror. The spine structure allows reduction of weight and mass of the mirror while maintaining mirror stiffness. The back layer may be a permanent magnet if the mirror oscillating drive is a magnetic drive. Alternately, the back layer may be another silicon slice.

31 Claims, 15 Drawing Sheets

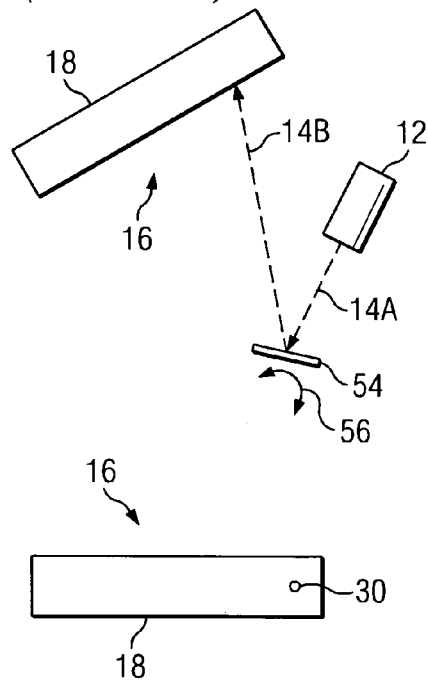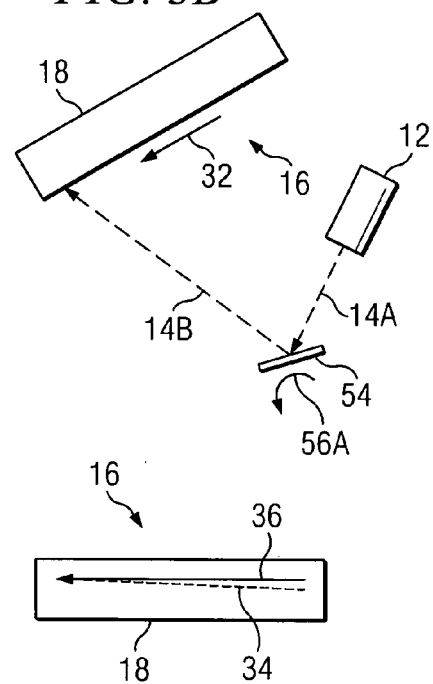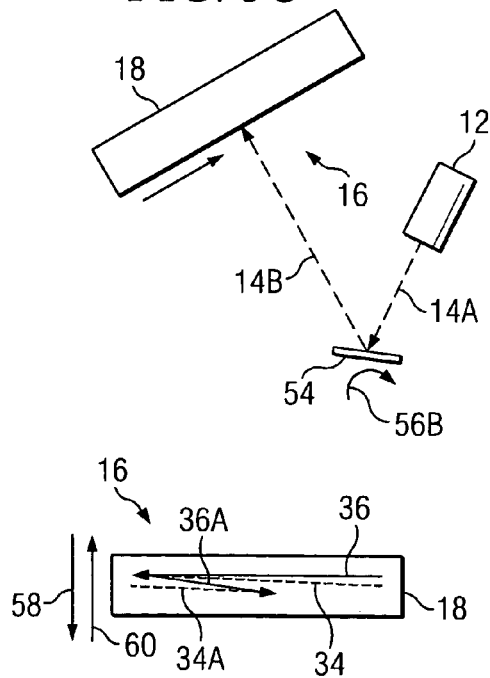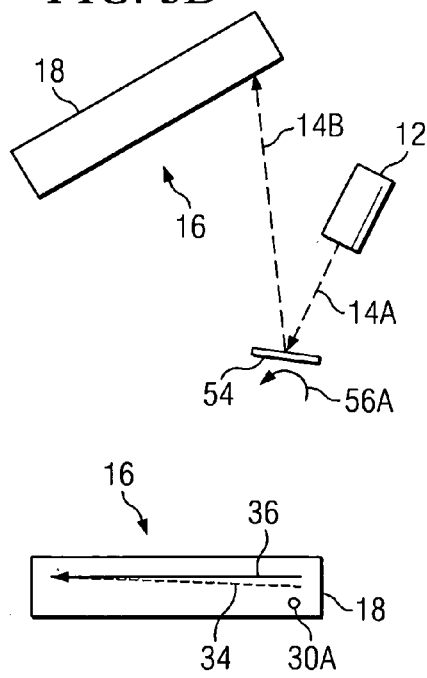

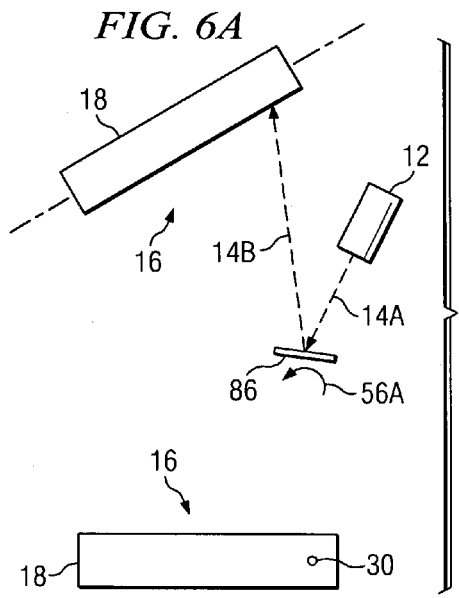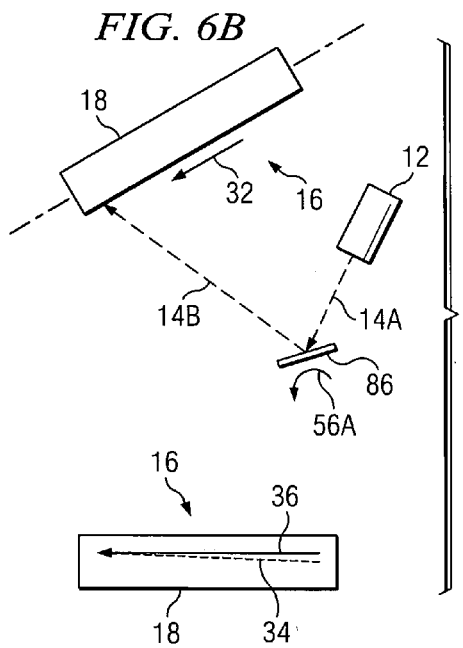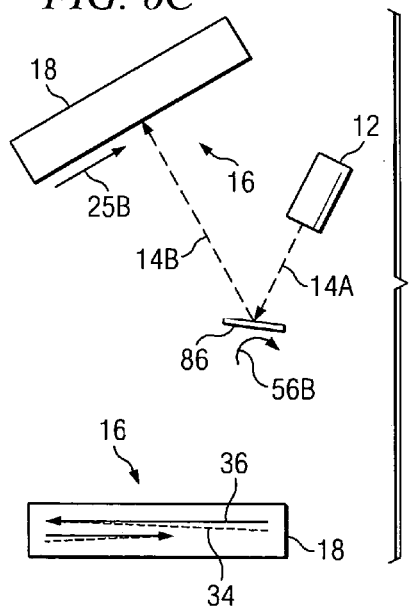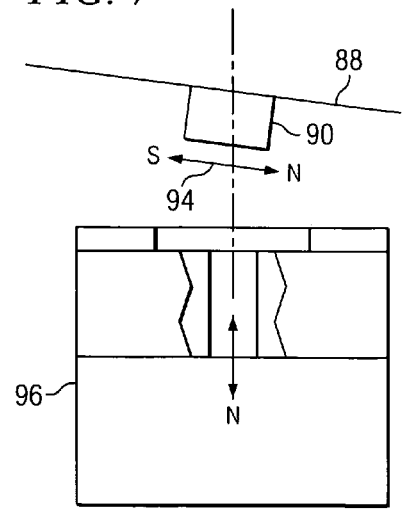

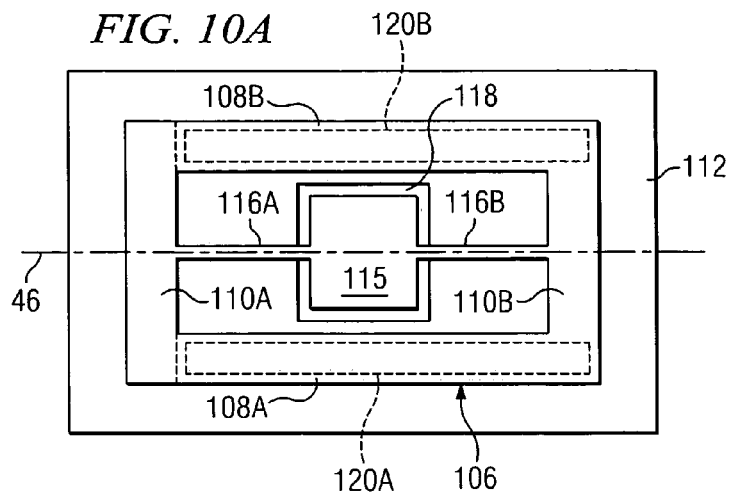
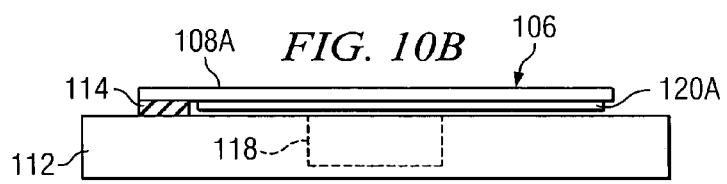
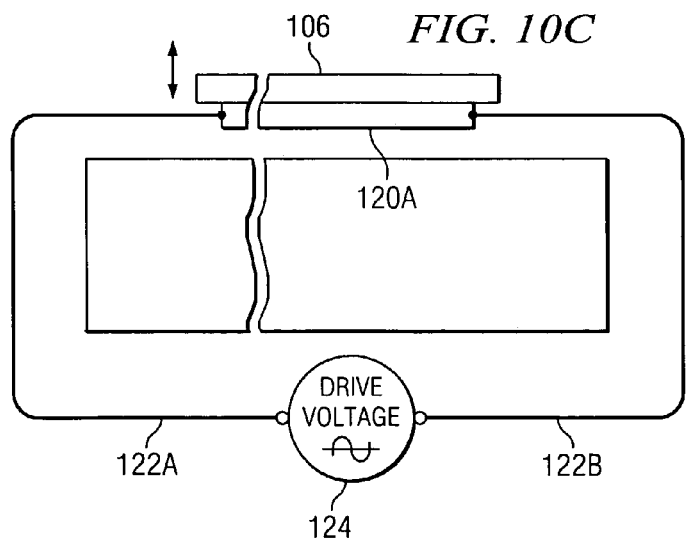

MULTILAYERED OSCILLATING DEVICE WITH SPINE SUPPORT

This application claims the benefit of U.S. Provisional Application No. 60/424,915 filed on Nov. 8, 2002, entitled "Composite MEMS Micromirror Structure for High Frequency Operation Without Dynamic Deformation," which application is hereby incorporated herein by reference.

CROSS-REFERENCE TO RELATED APPLICATIONS

This application relates to the co-pending and commonly assigned patent application Ser. No. 10/682,015 entitled "Multilayered Oscillating Functional Surface," filed concurrently herewith, which application is hereby incorporated herein by reference.

TECHNICAL FIELD

The present invention relates generally to rapidly pivoting multilayered MEMS (micro-electric mechanical systems) torsional hinge devices, and more specifically to high-speed pivoting mirrors, including scanning mirrors operating at a resonance frequency. A hinge layer having a first set of torsional hinges for providing the back and forth pivoting at a controlled frequency about a first axis includes an attaching member with a front side and a back side. A front layer having a functional surface, such as a mirror or reflective surface, is bonded or mounted to the front side of the hinge layer, and a back layer having a mass moment equal to the front layer is bonded or mounted to the back side of the hinge layer. According to one embodiment, the mass moment of the front layer is the mass of the front layer times the distance or offset of the center of the mass of the front layer from the first axis and the mass moment of the back layer is the mass of the back layer times the distance or offset of the center of the mass of the back layer from the first axis. The front layer and the attaching member of the hinge layer are etched to remove material that defines one or more spines extending to the ends of a functional surface, such as a mirror. According to another embodiment, the hinge layer further comprises a second pair of torsional hinges for rapidly pivoting the device about a second axis to control movement in a direction substantially orthogonal to the pivoting movement about the first set of torsional hinges. Such devices having a mirror as the functional surface are particularly suited for use as the drive engine for a laser printer and for generating a display on a screen. However, such rapidly pivoting mirrors may also be used to provide rapid switching in a fiber optic communication system.

BACKGROUND

Rotating polygon scanning mirrors are typically used in laser printers to provide a "raster" scan of the image of a laser light source across a moving photosensitive medium, such as a rotating drum. Such a system requires that the rotation of the photosensitive drum and the rotating polygon mirror be synchronized so that the beam of light (laser beam) sweeps or scans across the rotating drum in one direction as a facet of the polygon mirror rotates past the laser beam. The next facet of the rotating polygon mirror generates a similar scan or sweep which also traverses the rotating photosensitive drum but provides an image line that is spaced or displaced from the previous image line.

There have also been prior art efforts to use a less expensive flat mirror with a single reflective surface to provide a scanning beam. For example, a dual axis or single axis scanning mirror may be used to generate the beam sweep or scan instead of a rotating polygon mirror. The rotating photosensitive drum and the scanning mirror are synchronized as the drum rotates in a forward direction to produce a printed image line on the medium that is at right angles or orthogonal with the beam scan or sweep generated by the pivoting mirror.

However, with the single axis mirrors, the return sweep will traverse a trajectory on the moving photosensitive drum that is at an angle with the printed image line resulting from the previous or forward sweep. Consequently, use of a single axis resonant mirror, according to the prior art, required that the modulation of the reflected light beam be interrupted as the mirror completed the return sweep or cycle, and then turned on again as the beam starts scanning in the original direction. Using only one of the sweep directions of the mirror, of course, reduces the print speed. Therefore, to effectively use an inexpensive scanning mirror to provide bi-directional printing, the prior art typically required that the beam scans moved in a direction perpendicular to the scan such that the sweep of the mirror in each direction generates images on a moving or rotating photosensitive drum that are always parallel. This continuous perpendicular adjustment is preferably accomplished by the use of a dual axis torsional mirror, but could be accomplished by using a pair of single axis torsional mirrors. It has been discovered, however, at today's high print speeds both forward and reverse sweeps of a single axis mirror may be used, and that no orthogonal adjustment is necessary.

Texas Instruments presently manufactures torsional dual axis and single axis pivoting MEMS devices fabricated out of a single piece of material (such as silicon, for example) typically having a thickness of about 100–115 microns. The devices include a functional surface, such as a reflective surface or mirror. The dual axis layout may, for example, consist of a mirror supported on a gimbal frame by two silicon torsional hinges, whereas for a single axis device the mirror, or other functional surface, is supported directly by a pair of torsional hinges. The functional surface may be of any desired shape, although when the functional surface is a mirror, an elliptical shape having a long axis of about 4.6 millimeters and a short axis of about 1.5 millimeters is particularly useful. Such an elongated ellipse-shaped mirror is matched to the shape at which the angle of a light beam is received. The gimbal frame used by the dual axis device is attached to a support frame by another set of torsional hinges. These mirrors manufactured by Texas Instruments are particularly suitable for use as the scanning engine for high-speed laser printers and visual display. These high-speed mirrors are also suitable for use as high-speed optical switches in communication systems. One example of a dual axis torsional hinged mirror is disclosed in U.S. Pat. No. 6,295,154 entitled "Optical Switching Apparatus" and was assigned to the same assignee on the present invention.

According to the prior art, torsional hinge devices having a mirror as the functional surface were initially driven directly by magnetic coils interacting with small magnets mounted on the pivoting mirror at a location orthogonal to and away from the pivoting axis to oscillate the mirror or create the sweeping movement of the beam. In a similar manner, orthogonal movement of the beam sweep was also controlled by magnetic coils interacting with magnets mounted on the gimbals frame at a location orthogonal to the axis used to pivot the gimbals frame.

According to the earlier prior art, the magnetic coils controlling the mirror or reflective surface portion typically received an alternating positive and negative signal at a frequency suitable for oscillating the device at the desired rate. Little or no consideration was given to the resonant pivoting frequency of the device. Consequently, depending on the desired oscillating frequency or rate and the natural resonant frequency of the device about the pair of torsional hinges, significant energy could be required to pivot the device and especially to maintain the device in a state of oscillation. Furthermore, the magnets mounted on the functional surface of the device portion added mass and limited the oscillating speed.

Later torsional devices having a mirror as the functional surface were manufactured to have a specific resonant frequency substantially equivalent to the desired oscillation rate for applications where the mirror apparatus was used as the scanning engine. Various inertially coupled drive techniques including the use of piezoelectric devices and electrostatic devices have been used to initiate and keep the mirror oscillations at the resonant frequency.

It has now been discovered that the earlier inexpensive and dependable magnetic drive can also be used and set up in such a way to maintain the pivoting device at its resonant frequency or to provide orthogonal motion. Unfortunately, the added mass of the magnets becomes more and more of a problem as the required frequency increases to meet higher and higher operational speeds. Further, as mentioned above, although the reflecting surface of a scanning mirror can be of almost any shape, including square, round, elliptical, etc., an elongated elliptical shape has been found to be particularly suitable. Unfortunately, such elongated elliptical-shaped devices, such as a mirror, introduce inertia forces that result in excess flexing and bending of the functional surface of the device adjacent the hinges and tips of the device such that if the functional surface is a mirror, the mirror no longer meets the required "flatness" specifications for providing a satisfactory laser beam. The thickness of the device may be increased to maintain the necessary flatness, but the added weight and mass results in excess stress on the torsional hinges, which can cause failures and/or reduced life.

Therefore, a scanning device, such as a mirror, having both a low mass moment and sufficient stiffness to maintain acceptable flatness at high oscillation speeds would be advantageous.

SUMMARY OF THE INVENTION

The problems mentioned above are addressed by the present invention, which provides a multilayered device having a functional surface, such as a mirror. When the functional surface is a mirror, the mirror may be used as the means of generating a sweeping or scanning beam of light across a photosensitive medium. The pivoting device or apparatus comprises a hinge layer that defines an attaching member pivotally supported along a first axis by a first pair of torsional hinges extending to a support structure. The hinge layer has a front side and a back side. An operational or front layer having a functional surface portion, such as for example, only a mirror, is bonded to the front side of the attaching member, and a back layer having a mass moment (mass of back layer times offset or distance of back layer mass from the first axis) substantially equal to and opposite the mass moment of the mirror layer (mass of mirror layer times the offset or distance of mirror layer mass from the first axis) is bonded to the back side of the attaching member such that if a moment of inertia is created by the pivoting device, it will be centered on the first axis. The back layer is preferably a permanent magnet if the drive is a magnetic drive. Alternately, the back layer may be another material, such as silicon, if the drive is an inertia coupled drive.

To reduce the mass and weight of the device, the attaching member of the hinge layer and a back portion of the front or operational layer are formed to define one or more spines that extend from the pivot axis at the center of the device to the ends of the long edges of an elongated ellipse-shaped mirror functional surface. The spine(s) may be formed by controlled deposition, or by etching or removing material and may comprise a single spine member or a multiplicity of spine members. The reduced material of the spine structure compared to a solid structure means lower weight and mass and, consequently, the inertia and mass moment of the device is reduced as the spine(s) maintain the necessary stiffness to keep the functional surface of the device (such as for example, a mirror) sufficiently flat with less material.

According to this embodiment and as mentioned above, the hinge layer comprises a support member, such as a frame or an anchor pad, connected directly to the attaching member layer by the first pair of torsional hinges. Alternately, according to a dual axis embodiment, the hinge layer includes a second pair of torsional hinges extending between a support member, such as a frame, and a gimbals portion arranged to allow the gimbals portion to pivot about a second axis substantially orthogonal to the first axis. If the functional surface of the front or operational layer is a mirror, the operational layer with the mirror or reflective surface portion is attached to the gimbals portion by the first pair of torsional hinges. Thus, pivoting of a device having a mirror as the functional surface along the first axis and about the first pair of torsional hinges can be used to provide a beam of light reflected from the reflective surface that sweeps back and forth. Pivoting of the device about a second pair of torsional hinges results in the reflected light moving substantially orthogonal to the sweeping beam of light.

BRIEF DESCRIPTION OF THE DRAWINGS

Other objects and advantages of the invention will become apparent upon reading the following detailed description and upon referencing the accompanying drawings in which:

FIGS. 3A, 3B, 3C, and 3D illustrate a prior art example of using a single axis flat scanning mirror to generate a unidirectional beam sweep of a laser printer;

FIGS. 6A, 6B, and 6C illustrate the use of one two-axis scanning mirror such as is shown in FIGS. 5A and 5B to generate a bi-directional beam sweep of a laser;

FIG. 7 illustrates one embodiment of a single axis magnetic drive;

FIGS. 10A, 10B and 10C illustrate the operation of a piezoelectric drive to create inertia coupled oscillations in a pivoting device, such as a scanning mirror;

DETAILED DESCRIPTION OF ILLUSTRATIVE EMBODIMENTS

Like reference numbers in the figures are used herein to designate like elements throughout the various views of the present invention. The figures are not intended to be drawn to scale and in some instances, for illustrative purposes, the drawings may intentionally not be to scale. One of ordinary skill in the art will appreciate the many possible applications and variations of the present invention based on the following examples of possible embodiments of the present invention. The present invention relates to a high-speed pivoting device with a moveable functional surface. Various functional surfaces may be suitable for use with the invention. For example, a reflective surface or mirror is particularly suited for use as the functional surface and may be used to provide the raster scans for laser printers and displays or high-speed optical switching. More specifically, the invention relates to a pivoting structure and magnetic drive for maintaining high speed resonant pivoting of a functional surface, such as a mirror, about a pair of torsional hinges. Another functional surface may comprise, for example, a light grating. However, functional surfaces not related to the movement of light may also find application with the present invention.

Therefore, it will be appreciated that, although a reflective surface or mirror is primarily discussed as the functional surface of the present invention, the claims are not to be so limited unless such limitations are specifically included.

Figure 1A:
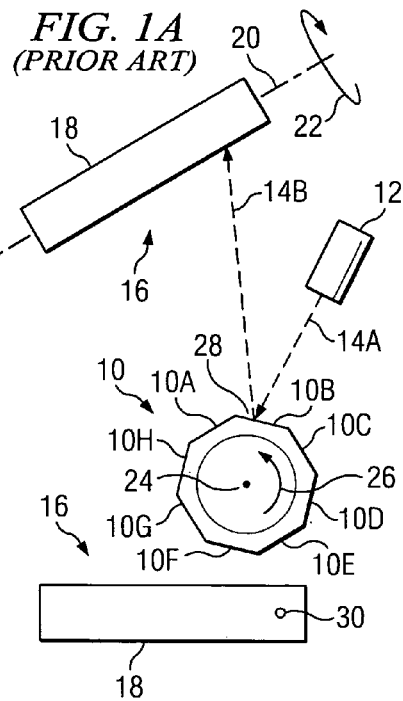
FIGS. 1A, 1B, and 1C illustrate the use of a rotating polygon mirror for generating the sweep of a laser printer according to the prior art.
Figure 1B:
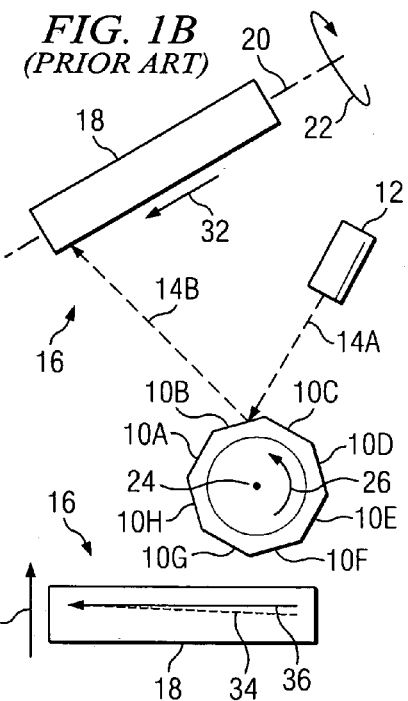
Figure 1C:
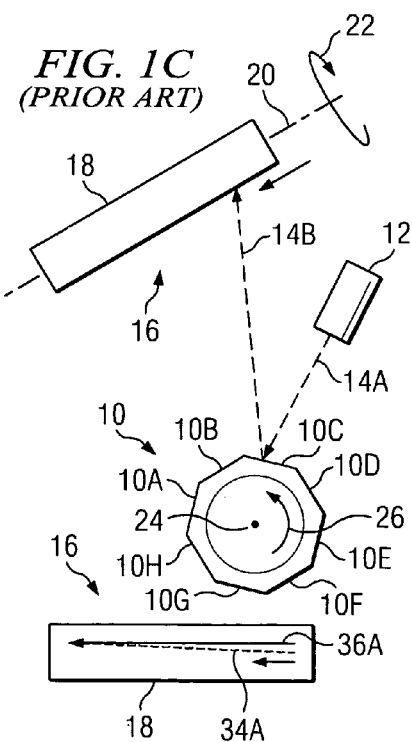

Referring now to FIGS. 1A, 1B and 1C, there is shown an illustration of the operation of a prior art printer using a rotating polygon mirror. As shown in FIG. 1A, there is a rotating polygon mirror 10 which in the illustration has eight reflective surfaces 110a–110h. A light source 12 produces a beam of light 14a, such as a laser beam, that is focused on the rotating polygon mirror so that the beam of light from the light source 12 is intercepted by the facets 110a –10h of rotating polygon mirror 10. Thus, the laser beam of light 14a from the light source 12 is reflected from the facets 10a–10h of the polygon mirror 10 as illustrated by dashed line 14b to a moving photosensitive medium 16 such as a rotating photosensitive drum 18 having an axis of rotation 20. The moving photosensitive medium 16 or drum 18 rotates around axis 20 in a direction as indicated by the arcurate arrow 22 such that the area of the moving photosensitive medium 16 or drum 18 exposed to the light beam 14b is continuously changing. As shown in FIG. 1A, the polygon mirror 10 is also rotating about an axis 24 (axis is perpendicular to the drawing in this view) as indicated by the second arcurate arrow 26. Thus, it can be seen that the leading edge 28 of facet 10b of rotating polygon mirror 10 will be the first part of facet 10b to intercept the laser beam of light 14a from the light source 12. As the mirror 10 rotates, each of the eight facets of mirror 10 will intercept the light beam 14a in turn. As will be appreciated by those skilled in the art, the optics to focus the light beam, the lens system to flatten the focal plane to the photosensitive drum, and any fold mirrors to change the direction of the scanned beam are omitted for ease of understanding.

Illustrated below the rotating polygon mirror 10 is a second view of the photosensitive medium 16 or drum 18 as seen from the polygon scanner. As shown by the photosensitive drum view 18, there is the beginning point 30 of an image of the laser beam 14b on drum 18 immediately after the facet 10b intercepts the light beam 14a and reflects it to the moving photosensitive medium 16 or drum 18.

Referring now to FIG. 1B, there is shown substantially the same arrangement as illustrated in FIG. 1A except the rotating polygon mirror 10 has continued its rotation about axis 24 such that the facet 10b has rotated so that its interception of the laser beam 14a is about to end. As will also be appreciated by those skilled in the art, because of the varying angle the mirror facets present to the intercepted light beam 14a, the reflected light beam 14b will move across the surface of the rotating drum as shown by arrow 32 and dashed line 34 in FIG. 1B.

However, it will also be appreciated that since rotating drum 18 was moving orthogonally with respect to the scanning movement of the light beam 14b, that if the axis of rotation 24 of the rotating mirror was exactly orthogonal to the axis 20 of the rotating photosensitive drum 18, an image of the sweeping or scanning light beam on the photosensitive drum would be recorded at a slight angle. As shown more clearly by the lower view of the photosensitive drum 18, dashed line 34 illustrates that the trajectory of the light beam 14b is itself at a slight angle, whereas the solid line 36 representing the resulting image on the photosensitive drum is not angled but orthogonal to the rotation or movement of the photosensitive medium 16. To accomplish this parallel printed line image 36, the rotating axis 24 of the polygon mirror 10 is typically mounted at a slight tilt with respect to the rotating photosensitive drum 18 so that the amount of vertical travel or distance traveled by the light beam along vertical axis 38 during a sweep or scan across medium 16 is equal to the amount of movement or rotation of the photosensitive medium 16 or drum 18. Alternately, if necessary, this tilt can also be accomplished using a fold mirror that is tilted.

FIG. 1C illustrates that facet 10b of rotating polygon mirror 10 has rotated away from the light beam 14a, and facet 10c has just intercepted the light beam. Thus, the process is repeated for a second image line. Continuous rotation will of course result in each facet of rotating mirror 10 intercepting light beam 14a so as to produce a series of parallel and spaced image lines, such as image line 36a, which when viewed together will form a line of print or other image.

It will be further appreciated by those skilled in the laser printing art, that the rotating polygon mirror is a very precise and expensive part or component of the laser printer that must spin at terrific speeds without undue wear of the bearings even for rather slow speed printers. Therefore, it would be desirable if a less complex flat mirror, such as for example a resonant flat mirror, could be used to replace the complex and heavy polygonal scanning mirror.

Figure 2A:
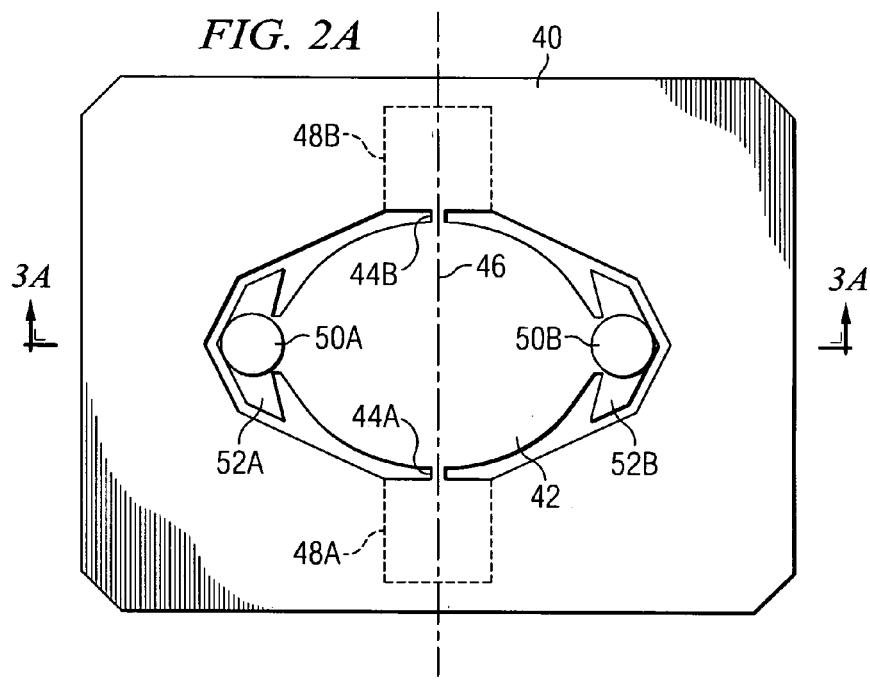
FIGS. 2A and 2B are embodiments of a single axis torsional hinge pivoting device having a mirror as the functional surface.
Figure 2B:
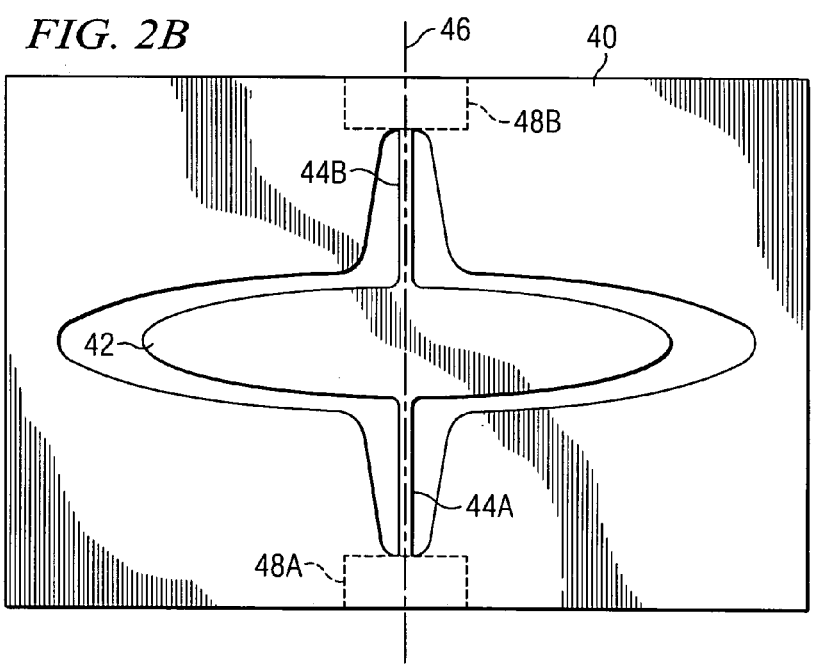

FIGS. 2A and 2B illustrate prior art single layer, single axis torsional devices having a mirror as the functional surface. Each of the devices of FIGS. 2A and 2B include a support member 40 supporting a functional surface, such as a mirror or reflective surface 42, which functional surface may be substantially any shape but for many applications the elongated ellipse shape of FIG. 2B is preferred. The pivoting functional surface is supported by a single pair of torsional hinges 44a and 44b. Thus, it will be appreciated that if the functional surface or mirror portion 42 can be maintained in an oscillation state around axis 46 by a drive source, such a mirror could be used to cause a sweeping light beam to repeatedly move across a photosensitive medium. Alternately, such a rapidly pivoting mirror could be used to rapidly switch a light beam across a plurality of optical fibers.

It will also be appreciated that an alternate embodiment of a single axis device may not require the support member or frame 40 as shown in FIGS. 2A and 2B. For example, as shown in both figures, the torsional hinges 44a and 44b may simply extend to a pair of hinge anchor pads 48a and 48b as shown in dotted lines. The functional surface, such as portion 42, may be suitably polished on its upper surface to provide a specular or mirror surface.

The prior art single layered devices having mirrors as the functional surface were typically MEMS (micro-electric mechanical systems) type mirrors manufactured from a slice of single crystal silicon. Further, because of the advantageous material properties of single crystalline silicon, MEMS based mirrors have a very sharp torsional resonance. The Q of the torsional resonance typically is in the range of 100 to over 1000. This sharp resonance results in a large mechanical amplification of the device's motion at a resonance frequency versus a non-resonant frequency. Therefore, it is typically advantageous to pivot a device about the scanning axis at the resonant frequency. This dramatically reduces the power needed to maintain the mirror in oscillation.

There are many possible drive mechanisms available to provide the oscillation or pivoting motion of the device and more specifically, if the functional surface is a mirror to provide an oscillating beam sweep along the scan axis. For example, FIG. 2A illustrates a prior art magnetic driver device having a pair of permanent magnets 50a and 50b mounted on tabs 52a and 52b respectively. The permanent magnets 50a and 50b interact with a pair of coils (not shown) located below the pivoting structure. The mechanical motion of the device in the scan axis, or about the primary hinges for a mirror, is typically required to be greater than 15 degrees and may be as great as 30 degrees. Resonant drive methods involve applying a small rotational motion at or near the resonant frequency of the device directly to the torsionally hinged functional surface, or alternately motion at the resonant frequency may be applied to the whole structure, which then excites the functional surface of the device to resonantly pivot or oscillate about its torsional axis. In inertial resonant type of drive methods a very small motion of the whole silicon structure can excite a very large rotational motion of the device. Suitable inertial resonant drive sources include piezoelectric drives and electrostatic drive circuits. A magnetic resonant drive that applies a resonant magnetic force directly to the torsional hinged functional surface portion has also been found to be suitable for generating the resonant oscillation for producing the back and forth beam sweep when the functional surface is a mirror.

Further, by carefully controlling the dimension of hinges 44a and 44b (i.e., width, length and thickness) the device may be manufactured to have a natural resonant frequency which is substantially the same as the desired pivoting speed or oscillating frequency of the device. Thus, by providing a device with a high-speed resonant frequency substantially equal to the desired pivoting speed or oscillating frequency, the power loading may be reduced.

Referring now to FIGS. 3A, 3B, 3C and 3D, there is illustrated a prior art example of a laser printer using a single-axis oscillating mirror to generate the beam sweep. As will be appreciated by those skilled in the art and as illustrated in the following figures, prior art efforts have typically been limited to only using one direction of the oscillating beam sweep because of the non-parallel image lines generated by the return sweep. As shown in FIGS. 3A, 3B, 3C and 3D, the arrangement is substantially the same as shown in FIGS. 1A, 1B and 1C except that the rotating polygon mirror has been replaced with a single oscillating flat mirror 54 that oscillates in both directions as indicated by double headed arcuate arrow 56. As was the case with respect to FIG. 1A, FIG. 3A illustrates the beginning of a beam sweep at point 30 by the single axis mirror 54. Likewise, arrow 32 and dashed line 34 in FIG. 3B illustrate the direction of the beam sweep as mirror 54 substantially completes its scan as it rotates in a direction as indicated by arrow 56a. Referring to the lower view of the photosensitive drum 18, according to this prior art embodiment, the mirror 54 is mounted at a slight angle such that the beam sweep is synchronized with the movement of the rotating drum 18 so that the distance the medium moves is equal to the vertical distance the light beam moves during a sweep. As was the case for the polygon mirror of FIG. 1B, the slightly angled trajectory as illustrated by dashed line 34 results in a horizontal image line 36 on the moving photosensitive medium 16 or drum 18.

Thus, up to this point, it would appear that the flat surface single torsional axis oscillating mirror 54 should work at least as well as the rotating polygon mirror 10 as discussed with respect to FIGS. 1A, 1B, and 1C. However, when the oscillating mirror starts pivoting back in the opposite direction as shown by the arcuate arrow 56b, with prior art scanning mirror printers, it was necessary to turn the beam, indicated by dashed line 34a in FIG. 3C, off and not print during the return sweep since the vertical movement of the mirror resulting from being mounted at a slight angle and the movement of the moving photosensitive medium 16 or rotating drum 18 were cumulative rather than subtractive. Consequently, if used for printing, the angled trajectory 34a of the return beam combined with movement of the rotating drum 18 would result in a printed image line 36a which is at even a greater angle than what would occur simply due to the movement of the rotating photosensitive drum 18. This, of course, is caused by the fact that as the beam sweep returns, it will be moving in a downward direction, as indicated by arrow 58, rather than an upward direction, whereas the photosensitive drum movement is in the upward direction indicated by arrow 60. Thus, as stated above, the movement of the drum and the beam trajectory are cumulative. Therefore, for satisfactory printing by a resonant scanning mirror printer according to the prior art, it was understood that the light beam and the printing were typically interrupted and/or stopped during the return trajectory of the scan. Thus, the oscillating mirror 54 was required to complete its reverse scan and then start its forward scan again as indicated at 30A, at which time the modulated laser was again turned on and a second image line printed as indicated in FIG. 3D.

Figure 4:
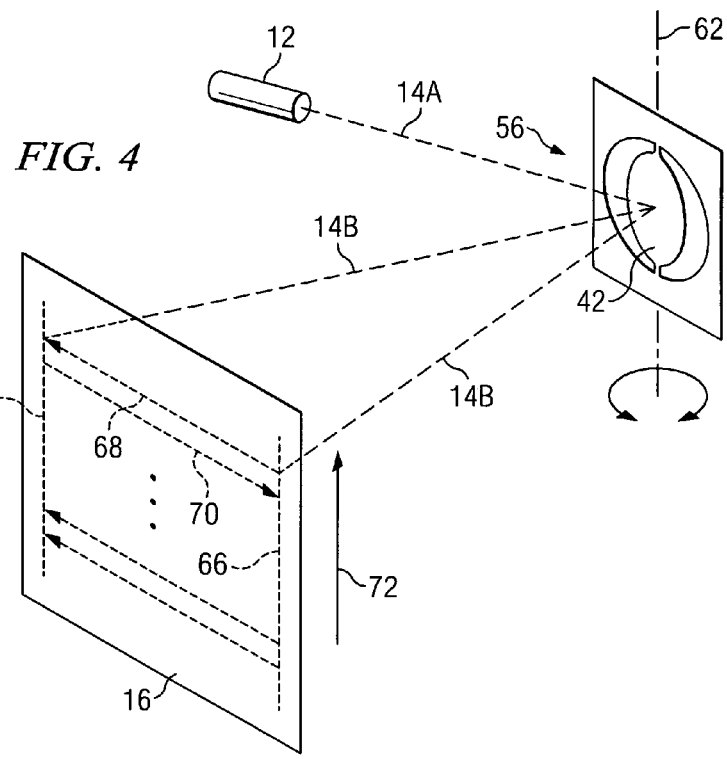
FIG. 4 is a perspective illustration of the single axis mirror of FIG. 2 to generate the beam sweep of a laser printer.

FIG. 4 illustrates a perspective illustration of a scanning mirror used to generate an image on a medium 16. The mirror device 56, such as the single axis mirror shown in FIGS. 2A and 2B, pivots about a single axis so that the reflecting surface 42 of the mirror device 56 receives the light beam 14a from source 12 and provides the right to left and left to right resonant beam sweep 14b between limits 64 and 66 as was discussed with respect to FIGS. 3A, 3B, 3C and 3D. This left to right and right to left beam sweep provides the parallel lines 68 and 70 as the medium 16 moves in the direction indicated by arrow 72.

It will also be appreciated that various shapes of the functional surface can be used in the practice of this invention, and that, when the functional surface of the device is a scanning mirror, the demand for higher and higher operating speeds will require a higher and higher oscillation speed of the device around the primary or scan axis. Similarly, high-speed pivoting of the device may also be necessary when the device is used as a high-speed optical switch. However, in addition to high-speed pivoting of the device, for most applications including scanning mirrors, it is also important that the device not deform as it pivots. More specifically, when the functional surface is a scanning mirror, it is important that the mirror not deform as it sweeps the laser beam across the photosensitive medium during a scan cycle. One way to avoid flexing or deforming of the device or mirror is to increase the thickness of the operation or front layer. Unfortunately, increasing the thickness results in increased stress on the torsional hinges due to an increase in weight, mass and moment of inertia.

Figure 5A:
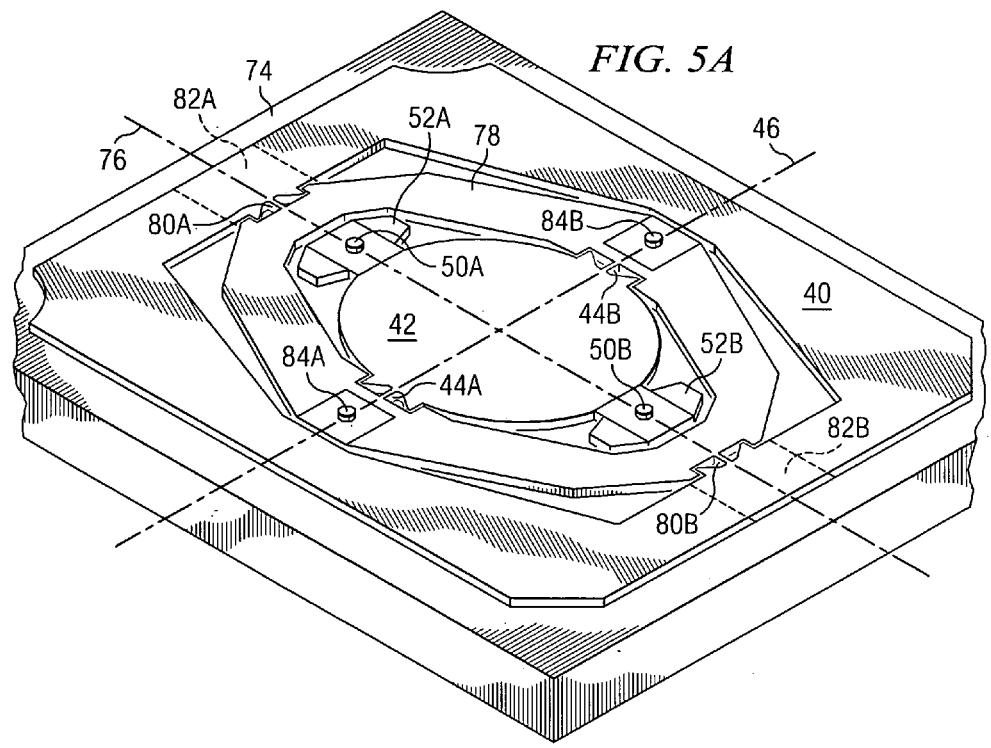
FIGS. 5A and 5B are perspective views of two embodiments of prior art two-axis torsional hinge devices having mirrors for generating a bi-directional beam sweep as the functional surface.
Figure 5B:
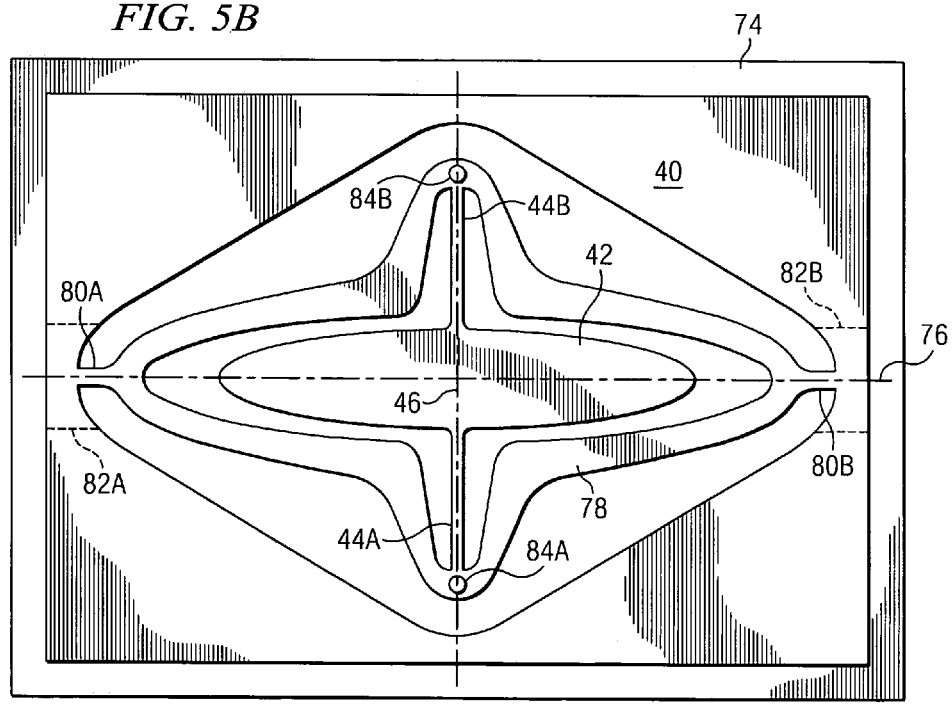

Referring now to FIGS. 5A and 5B, there is shown a perspective view and a top view, respectively, of two bi-directional devices wherein the functional surface 42 is a mirror. Such dual axis mirrors may be used to provide a high-speed beam sweep wherein the high-speed beam sweep is also adjusted in a direction orthogonal to the beam sweep. When used as a scanning engine for a printer, adjusting the beam sweep orthogonally allows the printed image lines produced by a beam sweep in one direction and then in a reverse direction to be maintained parallel to each other. As shown, the moveable assemblies of both FIGS. 5A and 5B are illustrated as being mounted on a support 74, and suitable for being driven along both axes 46 and 76. As was discussed above with respect to single axis resonant devices, the pivoting assembly may be formed from a substantially planar material and the functional or moving parts may be etched in the planar sheet of material (such as silicon) by techniques similar to those used in semiconductor art. As shown, the functional components include a support member or frame portion 40, similar to the single axis device. However, unlike the single axis device, the support structure of the dual axis device also includes an intermediate gimbals portion 78 as well as the functional surface such as mirror portion 42. It will be appreciated that the intermediate gimbals portion 78 is hinged to the support member or frame portion 40 at two ends by a pair of torsional hinges 80a and 80b spaced apart and aligned along an axis 76. Except for the pair of hinges 80a and 80b, the intermediate gimbals portion 78 is separated from the frame portion 40. It should also be appreciated that, although support member or frame portion 40 provides an excellent support for attaching the device to support structure 74, it may be desirable to eliminate the frame portion 40 and simply extend the torsional hinges 80a and 80b and anchor the hinges directly to the support 74 as indicated by anchors 82a and 82b shown in dotted lines on FIGS. 5A and 5B.

The inner, centrally disposed functional surface or mirror portion 42 is attached to gimbals portion 78 at hinges 44a and 44b along an axis 46 that is orthogonal to or rotated 90° from axis 76. The functional surface or mirror portion 42 for the embodiment shown is suitably polished on its upper surface to provide a specular or mirror surface. If desired, a coating of suitable material can be placed on the mirror portion to enhance its reflectivity for specific radiation wavelengths.

As was mentioned above with respect to single axis devices, there are many combinations of drive mechanisms for the scan or sweep axis. For the cross scan or orthogonal axis, since the angular motion required is usually much less, an electromagnetic drive may be used to produce a controlled movement about the torsional hinges 80a and 80b to orthogonally move and position the beam sweep to a precise position. Consequently, a set of permanent magnet sets 84a and 84b may be associated with the movement about hinges 80a and 80b.

FIGS. 6A, 6B and 6C illustrate the use of a dual axis scanning resonant mirror such as shown in FIGS. 5A and 5B as a scanning engine for a laser printer. As can be seen from FIGS. 6A and 6B, the operation of a dual axis scanning mirror assembly 86 as it scans from right to left in the figures is substantially the same as mirror 56 pivoting around a single axis as discussed and shown in FIGS. 3A–3D. However, unlike the single axis mirror 56 and as shown in FIG. 6C, it is not required to turn the laser (light beam 14b) off during the return scan, since a return or left to right scan in FIG. 6C can be continuously modulated during the return scan so as to produce a printed line or image on the moving photosensitive medium 16. The second printed line of images, according to the present invention, will be parallel to the previous right to left scan. This is, of course, accomplished by slight pivoting of the mirror 86 around orthogonal axis 76 of the dual axis mirror as was discussed above.

Further, as was discussed above with respect to a single axis device, by carefully controlling the dimension of hinges 44a and 44b (i.e., width, length and thickness) illustrated in FIGS. 5A and 5B, the device may be manufactured to have a natural resonant frequency which is substantially the same as the desired oscillating frequency of the device. Thus, by providing a functional surface with a resonant frequency substantially equal to the desired oscillating frequency, the power loading may be reduced.

From the above discussion, it will be appreciated that it is advantageous to manufacture a scanning mirror used as a drive engine for a visual display or printer to have a resonant frequency substantially the same as the desired raster or sweep frequency of a printer or display. As was also discussed, a magnetic drive is an inexpensive, dependable and effective technique for starting and maintaining the oscillating mirror at its resonant frequency. Unfortunately, the magnet sets 50a and 50b located on tabs 52a and 52b of the rotating surface of FIG. 5A adds to the mass and moment of inertia of the resonant mirror which in turn tends to reduce the resonant frequency of the mirror. For example, the resonant frequency of one dual axis magnetic drive mirror device of the type shown in FIG. 5A is about 100 Hz and would be even lower if the mirror size was increased. A speed of 100 Hz simply is not fast enough for many if not most applications. Therefore a mirror structure with a magnetic drive and increased resonant frequency would be advantageous.

Figure 8A:
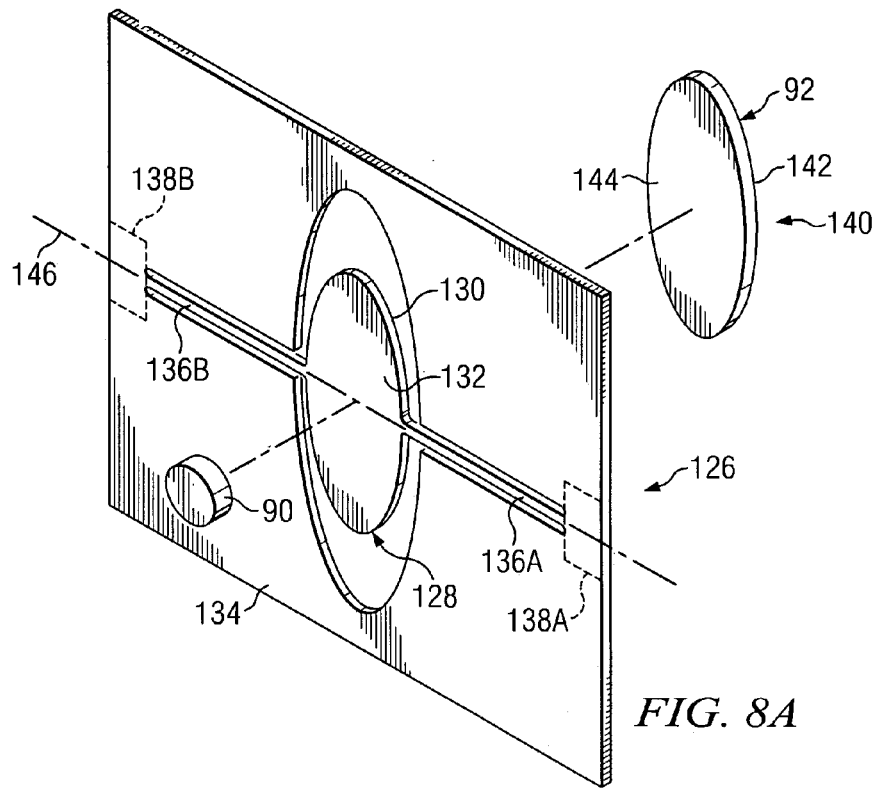
FIGS. 8A and 8B show an exploded view and an assembled view of a magnetic drive multilayered scanning device having a mirror as the functional surface.
Figure 8B:
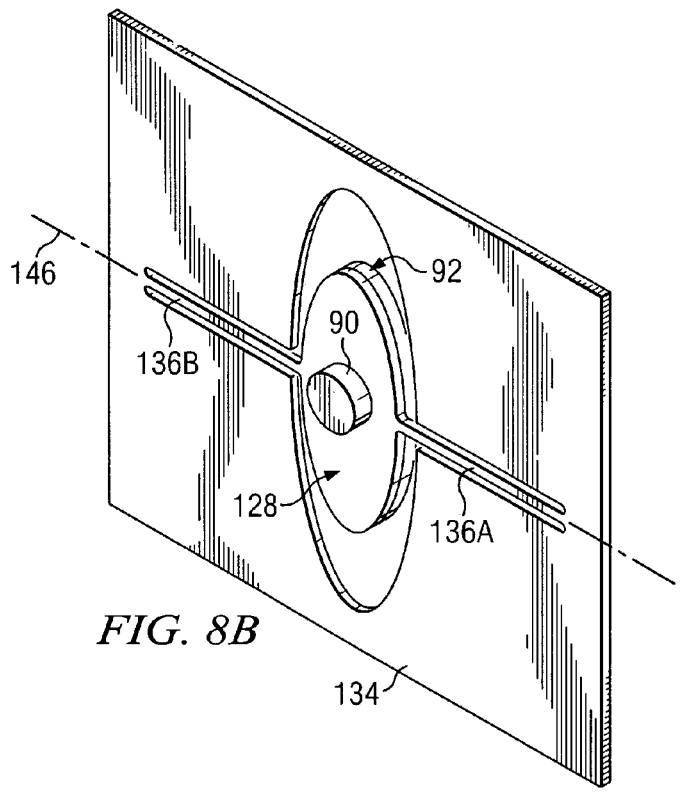

Referring now to FIG. 7, there is a simplified illustration of a pivoting structure 88 (such as the pivoting device shown in FIGS. 8A and 8B) and a permanent magnet arrangement that significantly reduces the moment of inertia of the apparatus. As shown in FIGS. 8A and 8B, the tabs 52a and 52b of FIG. 5A used to mount the permanent magnet sets 50a and 50b have been eliminated and a single magnet 90 is mounted on the pivoting device. According to the embodiment shown in FIG. 7, magnet 90 has a diametral charge perpendicular to the axis of rotation, as illustrated by double headed arrow 94, rather than an axial charge. It will, of course, also be necessary to relocate the drive coil 96 so that it is substantially below magnet 90.

Figure 9:
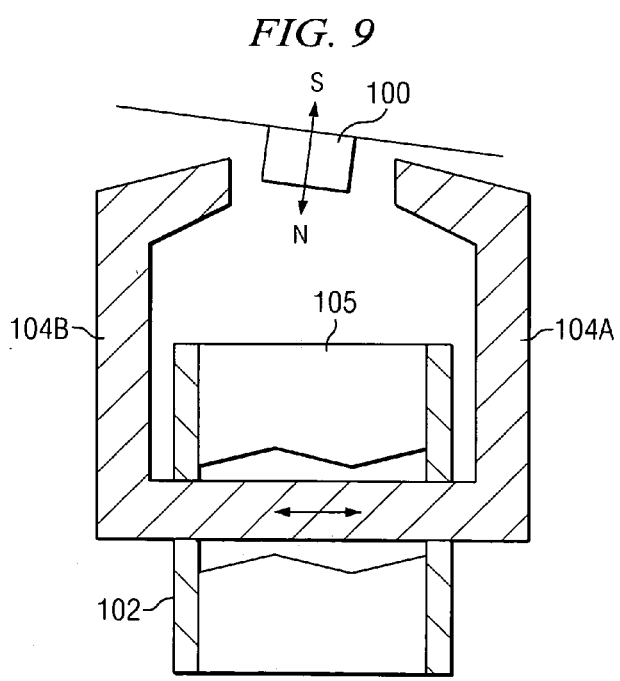
FIG. 9 illustrates a single axis magnetic drive according to another embodiment.

FIG. 9 shows a second magnetic drive arrangement. As shown, an axial charged magnet 100 is used instead of the diametral charged magnet of FIG. 7. Further, the coil 96 shown in FIG. 7 is replaced by an electro magnet device, such as device 102, having legs 104a 104b, that extend to each side of the magnet 100. Thus, an alternating current applied to coil 105 results in the magnetic field at the tips of legs 104a and 104b continuously changing polarity. This change in polarity creates alternating push-pull forces on magnet 100.

Figure 11A:
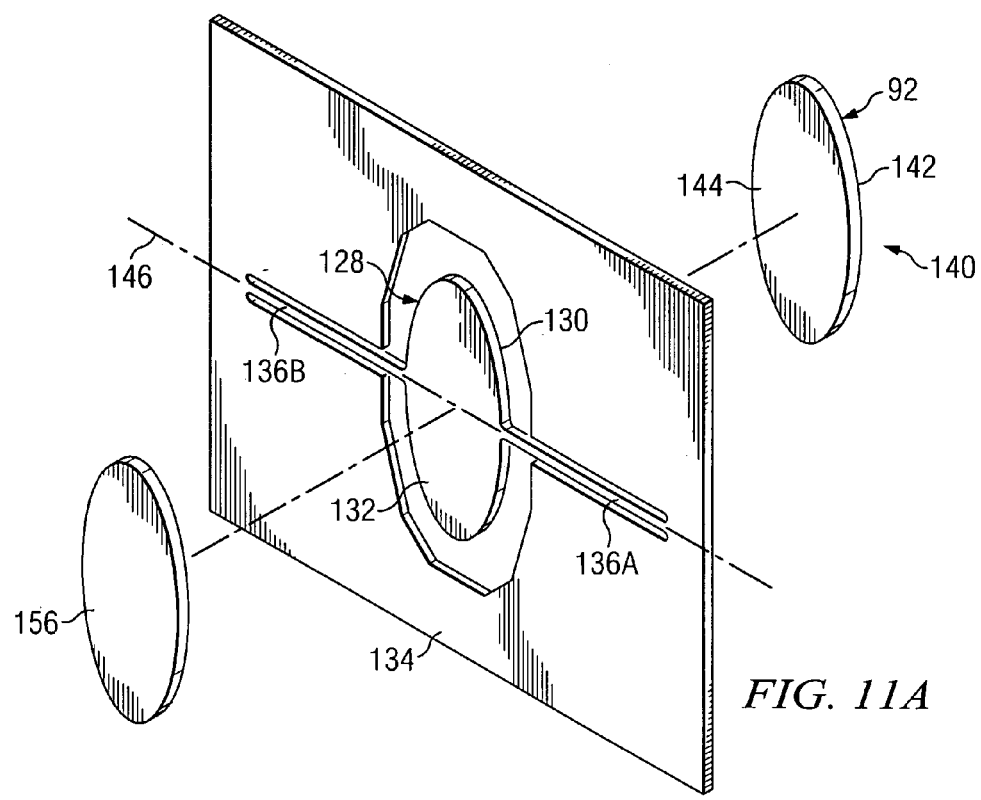
FIGS. 11A and 11B show an exploded view and an assembled view of a piezoelectric driven multilayered device having a mirror as the functional surface.
Figure 11B:
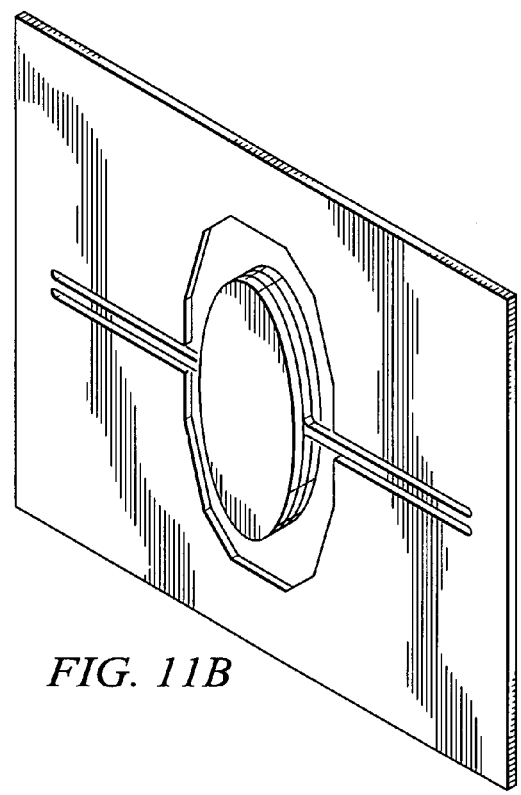

As also mentioned above, an inertially coupled resonant drive system may also be used to create resonant pivotal oscillation of the device. FIGS. 10A, 10B and 10C illustrate an arrangement of an inertially coupled piezoelectric drive. FIGS. 10A and 10B show a top view and a side view respectively of a single axis torsional hinged mirror device using piezoelectric elements to drive a device of the type shown in FIGS. 11A and 11B and to be discussed below, to resonance. As shown in FIGS. 10A and 10B, the apparatus includes a support frame 106 having two long sides 108a and 108b and two short sides 110a and 110b. The short side 110a is mounted to support structure 112 by means of stand-off 114. The mirror or functional surface portion 115 is attached to short sides 110a and 110b by the torsional hinges 116a and 116b such that the functional surface 115 is located above a cavity 118 in support structure 112. Slices of piezoelectric material 120a and 120b are bonded to long sides 108a and 108b of the support frame 106 as shown. The slices of piezoelectric material are sliced so that they bend or curve when a voltage is applied across the length of the strip or slice of material. As will be appreciated by those skilled in the art of piezoelectric materials, the response time is extremely fast such that an alternating voltage even having a frequency as high as between 2–25 KHz will cause the material to bend and flex at the same frequency as the applied voltage. Therefore, since the slices of piezoelectric material are bonded to the support frame of the mirror device, the application of an alternating voltage through conductors or wires 122a and 122b from the AC voltage source 124 and having a frequency substantially equal to the resonant frequency of the functional surface 115 as shown in FIG. 10C will cause vibration motion to be inertially coupled to functional surface or mirror portion 115 and thereby initiate and maintain the device in resonant oscillation.

The arrangement of piezoelectric slices discussed with respect to FIGS. 10A, 10B and 10C is for example only and other arrangements may be equally suitable for generating resonant motion.

Thus, from the above discussion it will be appreciated that high-speed mirrors may be used in high-speed optical switches as well as various printer and display applications. Further, resonant scanning mirrors having elongated elliptical shapes in the direction of rotation so that the light beam can be reflected from the mirror surface as long as possible may be the most cost effective and suitable for use in high speed printers and displays. However, these elongated elliptical shaped mirrors introduce a new set of problems and concerns when pivoting at high speed.

For example, such elongated elliptical mirrors are typically manufactured from a slice of single crystal silicon. At the same time, to achieve the very high resonant oscillation and hinge flexibility necessary to obtain sufficient rotational movement, it is necessary that the torsional hinges be very thin. Unfortunately, if the slice of single crystal silicon is sufficiently thin to fabricate torsional hinges that operate at high oscillating speeds, the structure may be too flexible to use as a flat reflecting surface. At high pivoting speeds, the tips of the elongated elliptical mirror travel at very high speeds and gain significant inertia. Consequently, the mirror tends to flex excessively proximate the torsional hinges and at the tips. This excessive flexing of course means that during some portions of the oscillating cycle, the mirror functional surface bends or flexes and is not flat. This means, for many applications, such as mirrors, will have too much curvature or flex during the oscillating cycle. This variation in mirror flatness at high frequencies is simply unacceptable for many displays, printers and optical switching applications.

One attempt at solving the conflict between the need for flexible hinges and a rigid or flat functional surface, such as a mirror, is the use of an additional layer of material as the functional surface. Therefore, referring again to FIGS. 8A and 8B, there is shown an exploded view and an assembled view of a single axis multilayered device wherein the functional surface is a scanning mirror. As shown, the multilayered scanning structure comprises a support structure or hinge layer 126 for pivotally supporting an attaching member 128 having a front side 130 and a back side 132 connected to an anchor member 134 by a pair of torsional hinges 136a and 136b. Anchor member 134 is a frame as shown in the multilayered device of FIGS. 8A and 8B. However, anchor member 134 could be replaced by a pair of anchor pads 138a and 138b as indicated by the dotted lines. The functional surface, such as mirror portion 92, is typically thicker than the hinge layer 126 and has a front portion 140 with reflecting surface 142 and a back portion 144. The back portion 144 is bonded or mounted to the front side 130 of the attaching member 128 and a back layer, such as, for example only, permanent magnet 90, is bonded or mounted to the back side 132 of the mirror attaching member 128. As shown, permanent magnet 90 is bonded along the axis 146 to the center of the back side 132 of mirror attaching member 128. Permanent magnet 90 is considerably stiffer than the hinge layer 124 and mirror portion 92 and consequently stiffens and reinforces the structure in the middle area where the magnet is located. The mass moment of the permanent magnet 90 (mass moment of permanent magnet 90 is the mass of the permanent magnet 90 times the offset distance of the center of mass of the permanent magnet 90 from axis 146) is selected to be substantially equal to and opposite the mass moment of the front portion 92 (mass of front portion 92 times the offset distance of the center of mass of front portion 92 from axis 146), such that the moment of inertia of the device is centered on the primary pivoting axis. More specifically, according to one embodiment of the invention the mass moment of the functional surface or mirror portion 92 is the product of the functional surface mass times the offset distance of the center of the mass of the functional surface from the axis of rotation 146, and the mass moment of the back layer is the product of the mass of the back layer times the offset distance of the center of mass of the back layer from the axis of rotation 146. FIG. 8B shows the assembled structure. The front or mirror portion 92 and permanent magnet 90 of the assembled structure of FIG. 8B, of course add significant weight that must be supported by the torsional hinges 136a and 136b, and if the entire front layer is simply made thick enough to maintain an acceptable level of flatness, the hinges are likely to be under excessive stress-due to the added weight. This added stress may result in unacceptable failure rates and short life.

If a device, such as a mirror, is to pivot or resonant at high speed with minimal drive energy and avoid excessive stress, engineering principles immediately suggest reducing the mass and weight of the oscillating device. However, reducing the mass of the device typically means thinning down the structure, and as discussed above, a thin structure also means a structure that is not as rigid (i.e., is flexible), and, as discussed above, a device, such as a mirror, that is too flexible is also unacceptable.

Figure 12A:
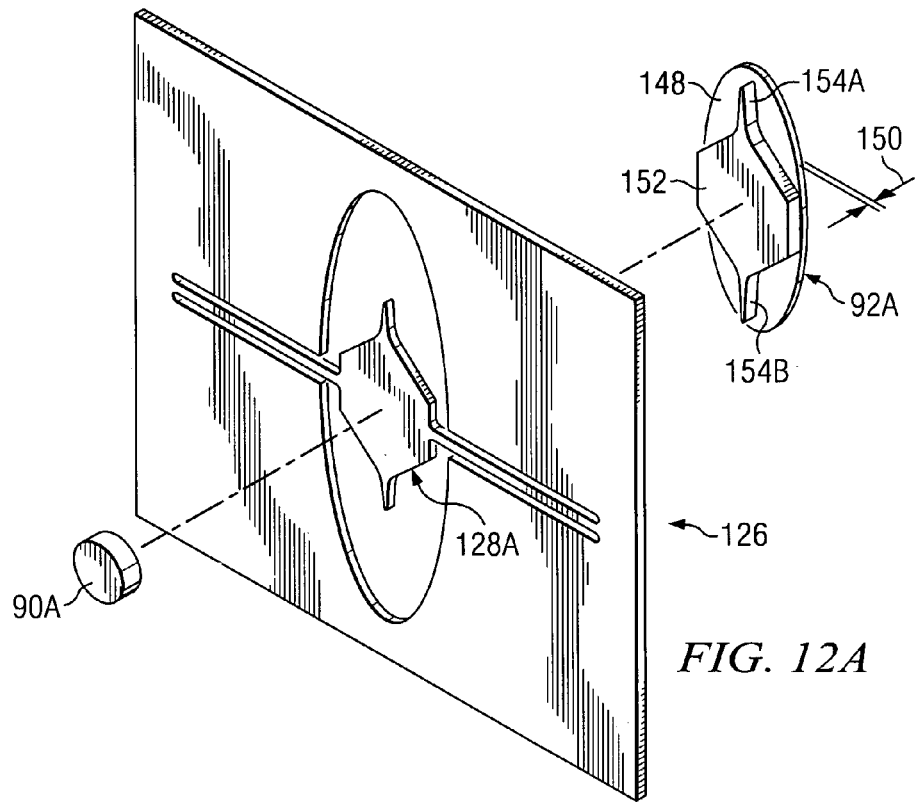
FIGS. 12A and 12B show an exploded view and an assembled view of an optimized magnetic drive multilayered high-speed device according to the present invention.
Figure 12B:
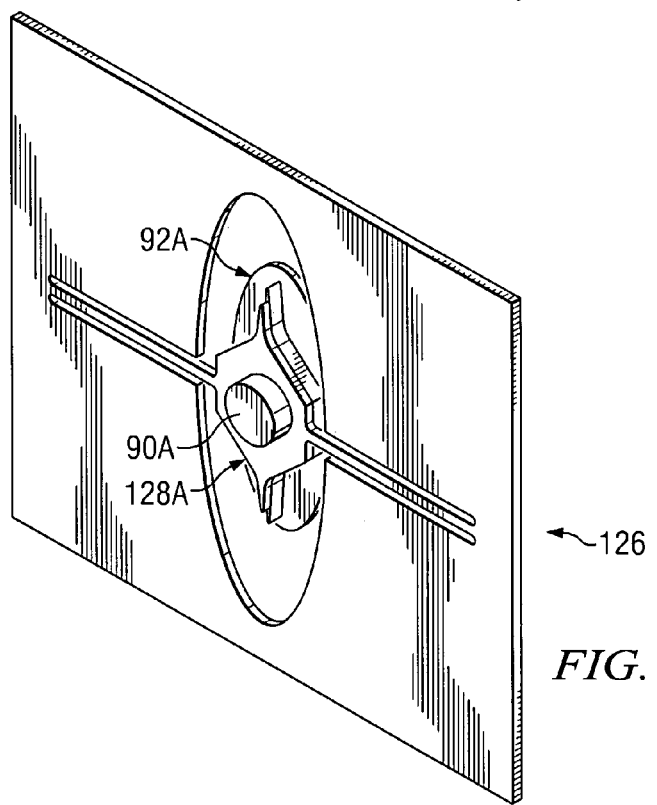

Therefore, referring to FIGS. 12A and 12B and according to one embodiment of the invention, there is shown an exploded view and an assembled view representing an optimized multilayered resonant device having a mirror as the functional surface. The device of FIGS. 12A and 12B have the same basic components as the device of FIGS. 8A and 8B, except the front or mirror layer 92a has a reflecting portion 148 with a first thickness as indicated by double arrows 150, and a back portion 152 defining at least one reinforcing ridge or member, such as for example, spines 154a and 154b that extend substantially to the edges or tips of the mirror layer 92a. Spines 154a and 154b are of course only examples, and the device could define two, three or more spines (not shown) extending from the hinge axis to the edges of the portion 92a. Further, the spines or reinforcing ridges may have other shapes and may be formed by any suitable method such as controlled deposition or etching to remove excess material. Thus, the absence of material at large areas of the front portion 92 reduces weight and mass while the formed spines or reinforcing or stiffening members 154a and 154b help maintain a satisfactory degree of stiffness. Similarly, material may also be removed or etched from the attaching member 128a of the hinge layer 126 to define a shape that is similar and substantially matches the shape of the back portion 152 of the front layer 92a. Finally, the diameter of the rigid permanent magnet 90a may be increased and the thickness reduced to provide still more rigidity or stiffness to the structure in the hinge area. It will also be appreciated as was the case in the embodiment of FIGS. 8A and 8B, that the mass moment of the permanent magnet 90a (mass of magnet 90a times the offset distance of the center of the mass of magnet 90a from axis 146) is balanced with the mass moment of the front layer 92a (mass of front layer 92a times the offset distance of the center of the mass of front layer 92a from axis 146).

Figure 13A:
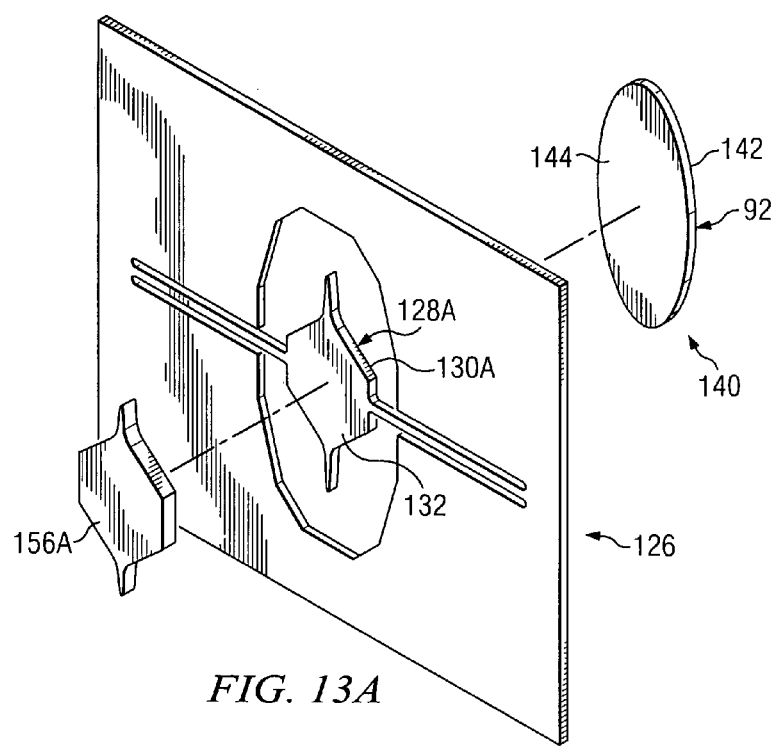
FIGS. 13A and 13B show an exploded view and an assembled view of a piezoelectric driven optimized multilayered high-speed device according to the present invention.
Figure 13B:
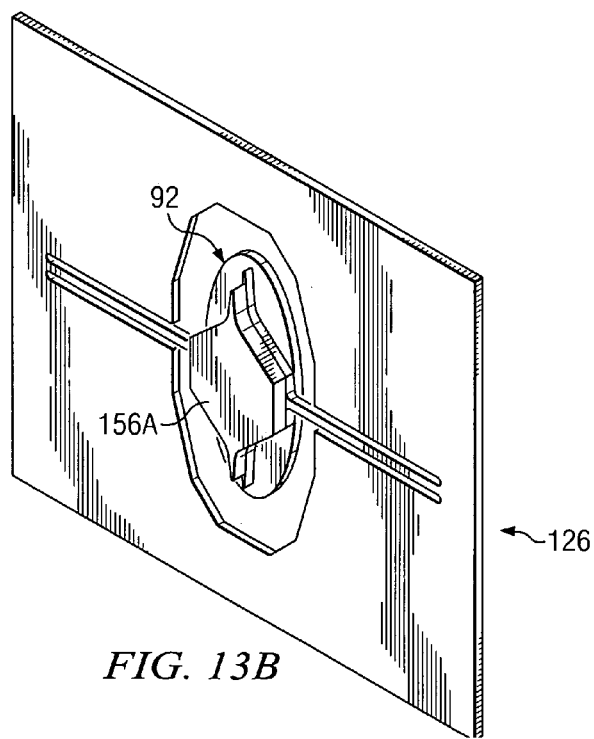

In addition to a pivoting device having a magnetic drive as shown in FIGS. 8A and 8B and 12A and 12B, the basic concepts discussed with respect to these figures are also applicable to resonant mirrors using inertia drive such as provided by a piezoelectric device as discussed above. Therefore, referring again to FIGS. 11A and 11B, there is shown an exploded view and an assembled view of a multilayered device having a resonant mirror as the functional surface suitable for use with a piezoelectric drive. Those elements of the structure that are equivalent to the elements of FIGS. 8A and 8B carry the same reference numbers. Therefore, as shown, FIGS. 11A and 11B differs with respect to FIGS. 8A and 8B only in the presence of a back layer 156 made of a material such as silicon rather than the permanent magnet 90. Further, according to the present invention as shown in FIGS. 13A and 13B, the back plate 156a may also be etched or have material removed such that it matches the etched attaching member 128a of hinge layer 126. Likewise, the front or mirror layer 92 of the embodiment of FIGS. 13A and 13B may be a flat portion as shown or may also have spines formed thereon as discussed with respect to FIG. 12A that also matches the shape of the spines on the attaching member 128a of the hinge support portion or layer 120.

Figures 14A, 14B:
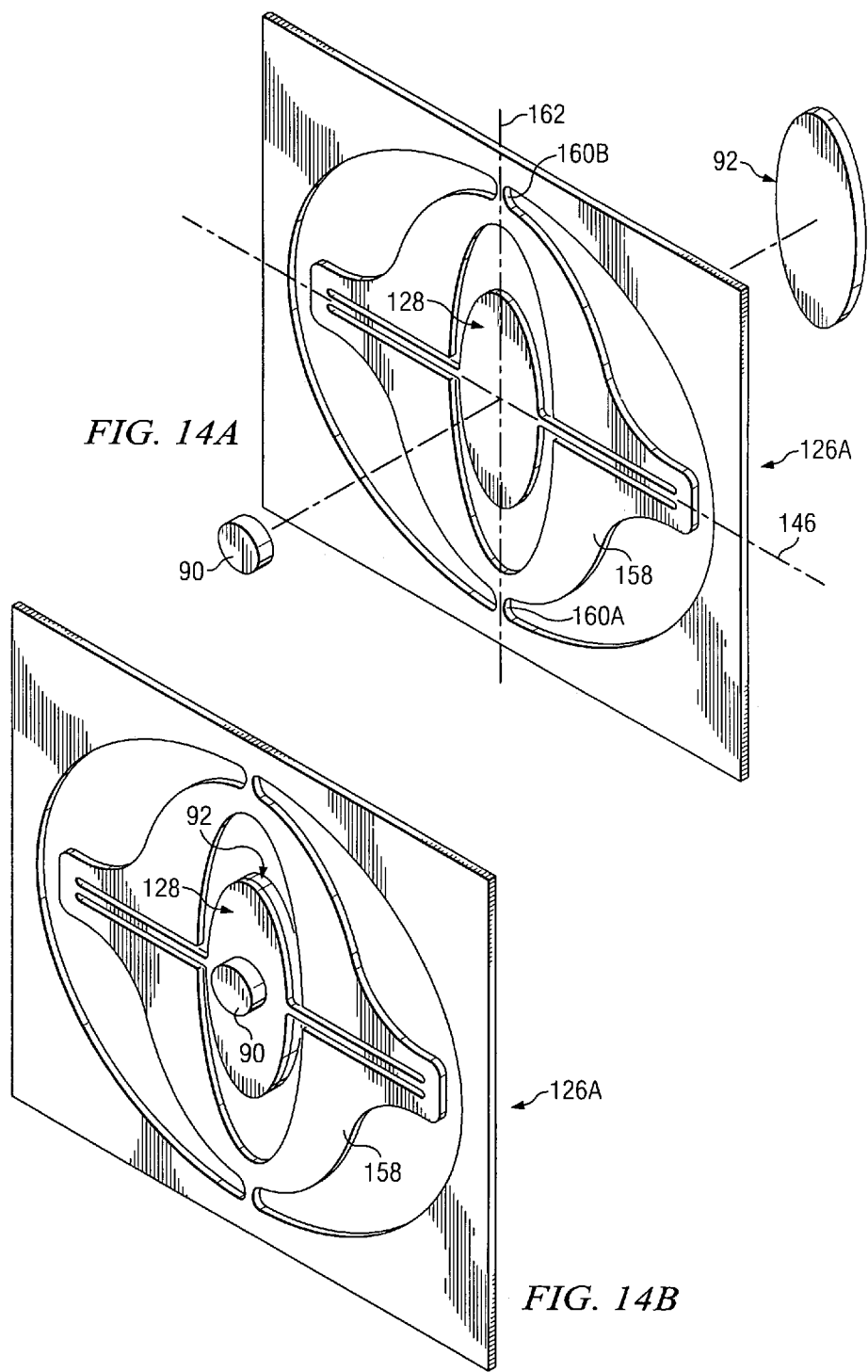
FIGS. 14A and 14B show an exploded view and an assembled view of a magnetic driven dual axis multilayered device having a mirror as the functional surface.

Likewise, FIGS. 14A and 14B show a dual axis multilayered magnetic drive resonant device. This pivoting mirror apparatus is substantially the same as that discussed with respect to FIGS. 8A and 8B except that the support structure or hinge layer 126a further defines the gimbals portion 158 which pivots orthogonally to the front portion along torsional hinges 160a and 160b and about axis 162.

Figures 15A, 15B:
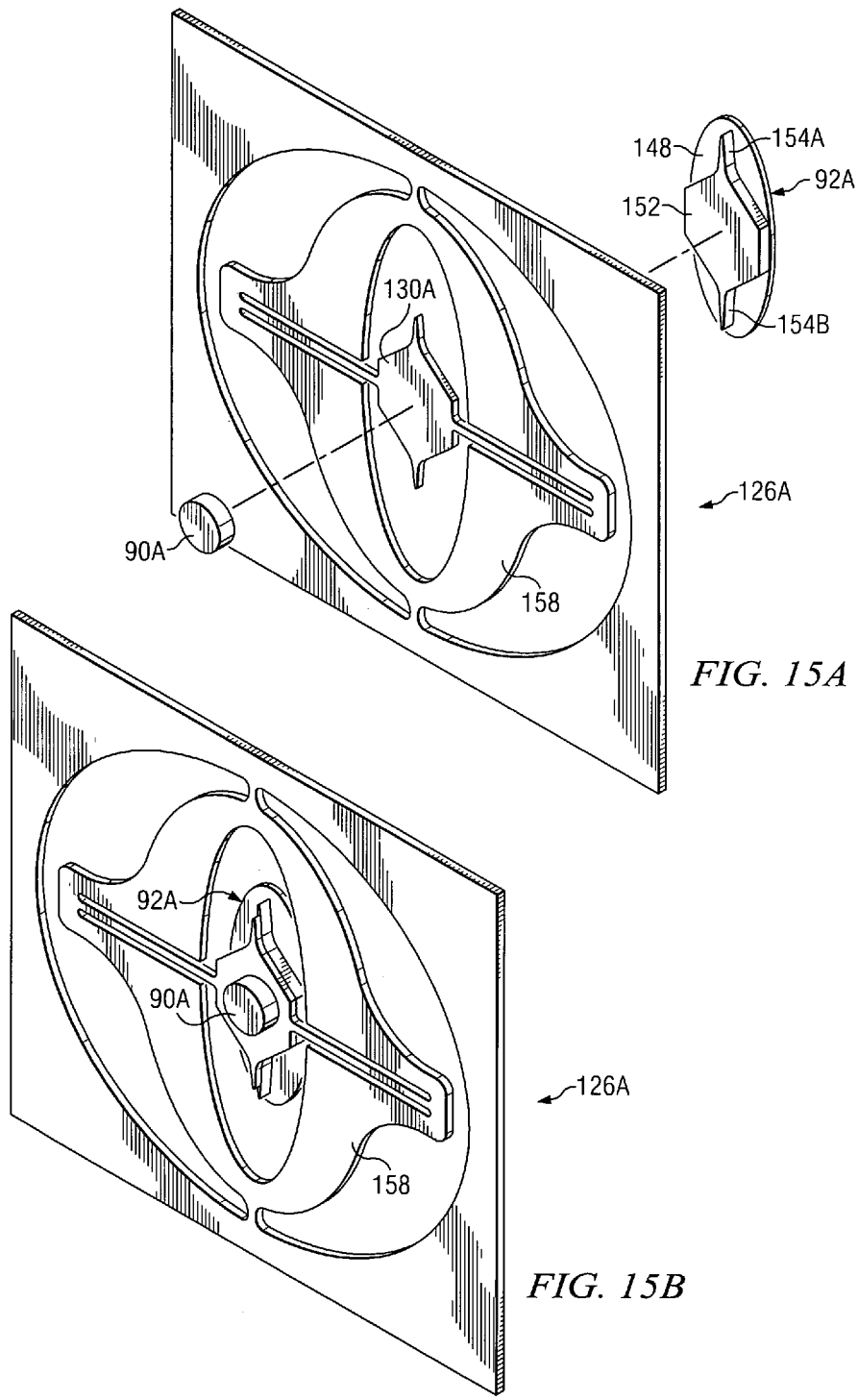
FIGS. 15A and 15B show an exploded view and an assembled view of a magnetic driven dual axis optimized multilayered high-speed device according to the present invention and having a mirror as the functional surface.

Similarly, FIGS. 15A and 15B are similar to the apparatus shown in FIGS. 14A and 14B except, according to the teaching of the present invention, the mirror attaching member and the mirror portion in FIGS. 15A and 15B have been optimized by removing or etching excess material in the same manner as was discussed with respect to FIGS. 12A and 12B.

Figures 16A, 16B:
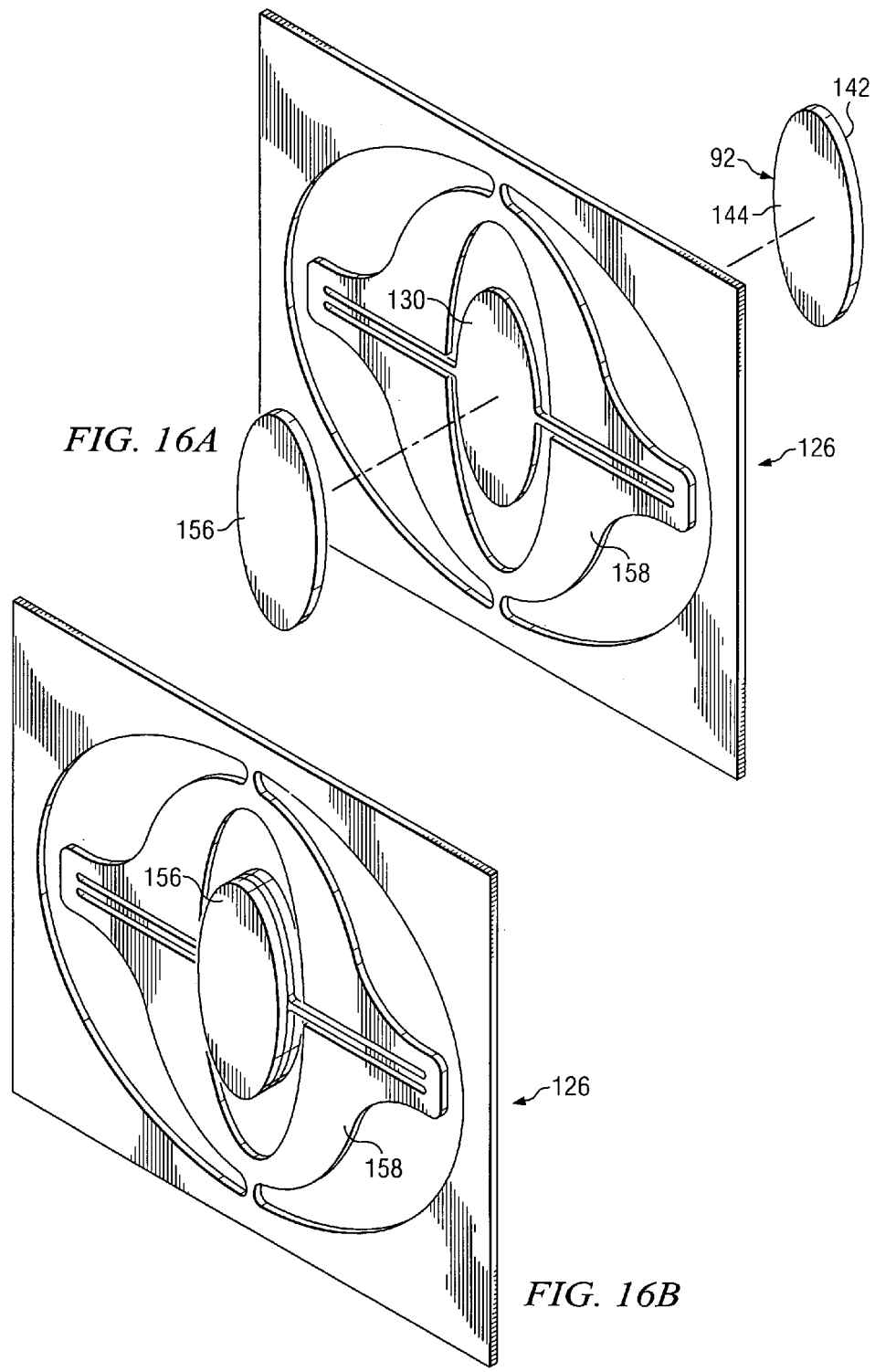
FIGS. 16A and 16B show an exploded view and an assembled view of a piezoelectric driven dual axis multilayered high-speed device.
Figures 17A, 17B:
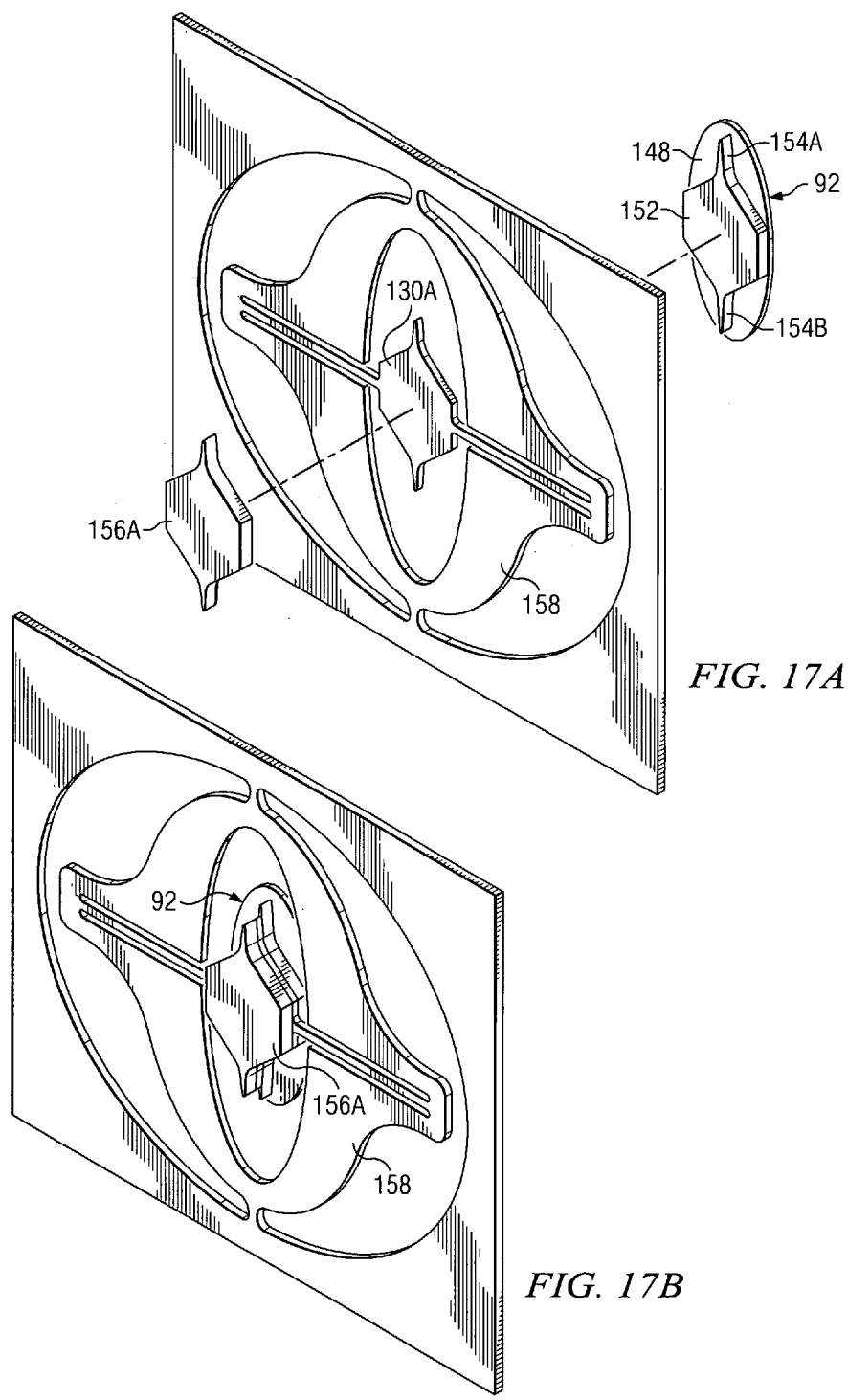
FIGS. 17A and 17B show an exploded view and an assembled view of a piezoelectric driven dual axis multilayered high-speed device optimized according to the present invention.

FIGS. 16A and 16B show an exploded view and an assembled view of a multilayered piezoelectric driven dual axis high-speed mirror; and FIGS. 17A and 17B illustrate an exploded view and an assembled view of a mirror similar to that of FIGS. 16A and 16B except that the back portion of the front layer or mirror, the attachment member and the back layer have been optimized by removing or etching excess material.

The foregoing descriptions of specific embodiments of the present invention have been presented for purposes of illustration and description. They are not intended to be exhaustive or to limit the invention to the precise forms disclosed as many modifications and variations are possible in light of the above teaching. The embodiments were chosen and described in order to best explain the principles of the invention and its practical application to thereby enable others skilled in the art to best utilize the invention and various embodiments with various modifications as are suited to the particular use contemplated. It is intended that the scope of the invention be defined by the claims appended hereto and their equivalents.

What is claimed is:

1. A multilayered torsional hinged resonant pivoting device comprising:
    a hinge layer defining a support structure and an attaching member, said support structure for pivotally supporting said attaching member along a first axis of rotation by a pair of torsional hinges, said attaching member having a front side and a back side, and said attaching member defining spines extending in opposite directions and away from said first axis;

a front layer having a front portion, a back portion and a selected thickness, said back portion of said front layer mounted to said front side of said attaching member and said front layer having a known mass moment about said first axis; and a back layer mounted on said back side of said attaching member and having a mass moment substantially equal to and opposite said known mass moment of said front layer, such that the center of mass of the combined front and back layers is substantially coplanar with the first axis of rotation and the moment of inertia of said multilayered torsional hinged device is substantially centered on said first axis of rotation.

2. The multilayered device of claim 1 wherein said front portion of said front layer has a first size and shape and said back portion of said front layer further defines spines corresponding to said spines defined by said attaching member.

3. The multilayered device of claim 2 wherein said back layer further defines spines corresponding to said spines defined by said attaching member.

4. The multilayered device of claim 1 wherein said back layer further defines spines corresponding to said spines defined by said attaching member.

5. The multilayered device of claim 1 wherein said hinge layer comprises an anchor member connected to said attaching member along said first axis by said first pair of torsional hinges.

6. The multilayered device of claim 5 wherein said anchor member is a support frame.

7. The multilayered device of claim 5 wherein said anchor member is a pair of anchor pads.

8. The multilayered device of claim 1 wherein said support structure of said hinge layer comprises a gimbals portion connected to said attaching member along said first axis by said pair of torsional hinges and an anchor member pivotally supporting said gimbals portion by a second pair of torsional hinges along a second axis substantially orthogonal to said first axis.

9. The multilayered device of claim 3 wherein said support structure of said hinge layer comprises a gimbals portion connected to said attaching member along said first axis by said pair of torsional hinges and an anchor member pivotally supporting said gimbals portion by a second pair of torsional hinges along a second axis substantially orthogonal to said first axis.

10. The multilayered device of claim 8 wherein said anchor member is a support frame.

11. The multilayered device of claim 1 wherein said back layer is a permanent magnet.

12. The multilayered device of claim 2 wherein said back layer is a permanent magnet.

13. The multilayered device of claim 11 and further comprising a magnetic coil connected to an alternating voltage having a frequency substantially equal to the resonant frequency of the pivoting device and wherein said magnetic coil and said permanent magnet interact to create pivotal movement of said device at said resonant frequency.

14. The multilayered device of claim 12 and further comprising a magnetic coil connected to an alternating voltage having a frequency substantially equal to the resonant frequency of the pivoting device and wherein said magnetic coil and said permanent magnet interact to create pivotal movement of said device at said resonant frequency.

15. The multilayered device of claim 2 wherein said front portion of said front layer is a reflective surface and said multilayered device is a scanning mirror.

16. The multilayered device of claim 15 wherein said back layer further defines spines corresponding to said spines defined by said attaching member.

17. The multilayered device of claim 15 wherein said back layer is a permanent magnet.

18. The multilayered device of claim 17 wherein said support structure of said hinge layer comprises a gimbals portion connected to said attaching member along said first axis by said pair of torsional hinges and an anchor member pivotally supporting said gimbals portion by a second pair of torsional hinges along a second axis substantially orthogonal to said first axis.

19. The multilayered device of claim 18 and further comprising a magnetic coil connected to an alternating voltage having a frequency equal to a selected sweep frequency of said scanning mirror and wherein said magnetic coil and said permanent magnet interact to create pivotal oscillations of said scanning mirror at said selected sweep frequency.

20. The multilayered device of claim 19 wherein said selected sweep frequency is substantially equal to the resonant pivoting frequency.

21. The multilayered device of claim 17 and further comprising a magnetic coil connected to an alternating voltage having a frequency equal to a selected sweep frequency of said scanning mirror and wherein said magnetic coil and said permanent magnet interact to create pivotal oscillations of said scanning mirror at said selected sweep frequency.

22. The multilayered device of claim 21 wherein said selected sweep frequency is substantially equal, to the resonant pivoting frequency.

23. The multilayered device of claim 3 and further comprising piezoelectric material bonded to said support structure of said hinge layer to create resonant pivoting of said mirror.

24. The multilayered device of claim 1 wherein said hinge layer is made from single crystal silicon.

25. The multilayered device of claim 2 wherein said hinge layer is made from single crystal silicon.

26. The multilayered device of claim 3 wherein said hinge layer is made from single crystal silicon.

27. The multilayered device of claim 24 wherein said front layer is made from single crystal silicon.

28. The multilayered device of claim 25 wherein said front layer is made from single crystal silicon.

29. The multilayered device of claim 26 wherein said front layer is made from single crystal silicon.

30. The multilayered device of claim 17 and further comprising a magnetic coil connected to an alternating voltage having a frequency equal to a selected sweep frequency of said scanning mirror and wherein said magnetic coil and said permanent magnet interact to create pivotal oscillations of said scanning mirror at said selected sweep frequency.

31. The multilayered device of claim 30 wherein said selected sweep frequency is substantially equal to the resonant pivoting frequency.

* * * * *